(12) United States Patent
Kim et al.

(10) Patent No.: US 12,288,977 B2
(45) Date of Patent: Apr. 29, 2025

(54) FUSION BONDING PROTECTING MODULE AND BATTERY SYSTEM INCLUDING THE SAME

(71) Applicant: LG Energy Solution, Ltd., Seoul (KR)

(72) Inventors: Kihoon Kim, Daejeon (KR); Changyong Song, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 18/265,038

(22) PCT Filed: Sep. 6, 2022

(86) PCT No.: PCT/KR2022/013360
§ 371 (c)(1),
(2) Date: Jun. 2, 2023

(87) PCT Pub. No.: WO2023/038400
PCT Pub. Date: Mar. 16, 2023

(65) Prior Publication Data
US 2024/0055854 A1 Feb. 15, 2024

(30) Foreign Application Priority Data
Sep. 8, 2021 (KR) .................. 10-2021-0119710

(51) Int. Cl.
*H02H 7/00* (2006.01)
*H02H 7/20* (2006.01)
(Continued)

(52) U.S. Cl.
CPC ............. *H02H 7/20* (2013.01); *H03K 3/037* (2013.01); *H03K 19/20* (2013.01)

(58) Field of Classification Search
None
See application file for complete search history.

(56) References Cited

U.S. PATENT DOCUMENTS 6,091,223 A * 7/2000 Rogers .................. B60L 3/0069
320/128
6,198,255 B1 3/2001 Yoshida
(Continued)

FOREIGN PATENT DOCUMENTS

CN 112255577 A 1/2021
JP 2000358335 A 12/2000
(Continued)

OTHER PUBLICATIONS

International Search Report for PCT/KR2022/013360 mailed Jan. 2, 2023. 3 pages.
(Continued)

*Primary Examiner* — Stephen W Jackson
(74) *Attorney, Agent, or Firm* — Lerner David LLP

(57) ABSTRACT

A fusion bonding protecting module configured to control a negative contactor connected between a negative electrode of a battery pack and a second output end according to fusion and bonding of a positive contactor connected between a positive electrode of the battery pack and a first output end, including: an set/reset (SR) latch including a set terminal configured to receive a fusion bonding sensing signal according to whether the positive contactor is fused and bonded and a reset terminal for receiving a comparison signal according to a voltage difference between a first end and a second end of the positive contactor; and an AND gate configured to generate a compensation control signal in response to receiving both a logic control signal that is an inverted output of the SR latch and a control signal for controlling the negative contactor.

11 Claims, 3 Drawing Sheets

(51) Int. Cl.
  *H03K 3/037* (2006.01)
  *H03K 19/20* (2006.01)

(56) References Cited

U.S. PATENT DOCUMENTS

| | | | |
|---|---|---|---|
| 8,531,113 | B2 | 9/2013 | Jung et al. |
| 10,637,270 | B2 | 4/2020 | Chen |
| 11,190,007 | B2 * | 11/2021 | Zhang .................... H02H 3/025 |
| 2002/0070608 | A1 | 6/2002 | Matsuki et al. |
| 2005/0185350 | A1 * | 8/2005 | Wakefield ............ H02H 7/0816 |
| | | | 361/23 |
| 2012/0146550 | A1 | 6/2012 | Takahashi et al. |
| 2013/0268158 | A1 | 10/2013 | Kurita |
| 2017/0089982 | A1 | 3/2017 | Hwang et al. |
| 2018/0024196 | A1 | 1/2018 | Mura et al. |
| 2018/0299500 | A1 | 10/2018 | Lee |
| 2019/0025362 | A1 | 1/2019 | Mochizuki et al. |
| 2019/0271743 | A1 | 9/2019 | Imura et al. |
| 2020/0209341 | A1 * | 7/2020 | Ylamurto ............ H04W 56/004 |
| 2022/0242269 | A1 * | 8/2022 | Koolen ................. H02J 7/0013 |

FOREIGN PATENT DOCUMENTS

| | | |
|---|---|---|
| JP | 2002175750 A | 6/2002 |
| JP | 2003102101 A | 4/2003 |
| JP | 2013219873 A | 10/2013 |
| JP | 2017034801 A | 2/2017 |
| KR | 20100064068 A | 6/2010 |
| KR | 20120043081 A | 5/2012 |
| KR | 101664745 B1 | 10/2016 |
| KR | 20170097481 A | 8/2017 |
| KR | 102006966 B1 | 8/2019 |
| KR | 102085398 B1 | 3/2020 |
| KR | 20200072824 A | 6/2020 |
| WO | 2016103721 A1 | 6/2016 |

OTHER PUBLICATIONS

Extended European Search Report including Written Opinion for Application No. 22867669.8 dated Jul. 22, 2024. 7 pgs.

* cited by examiner

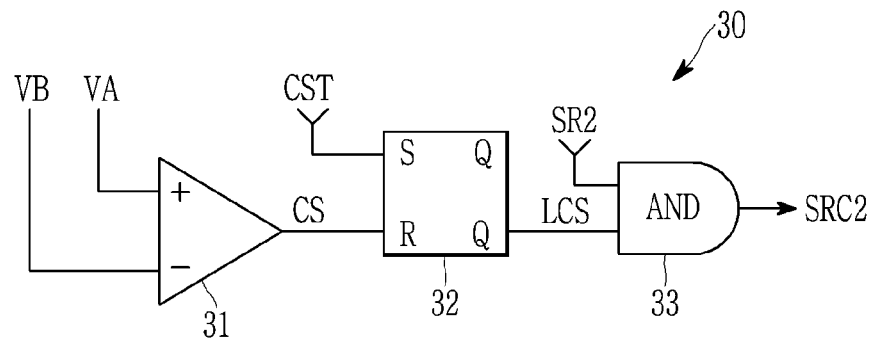
[FIG. 2]
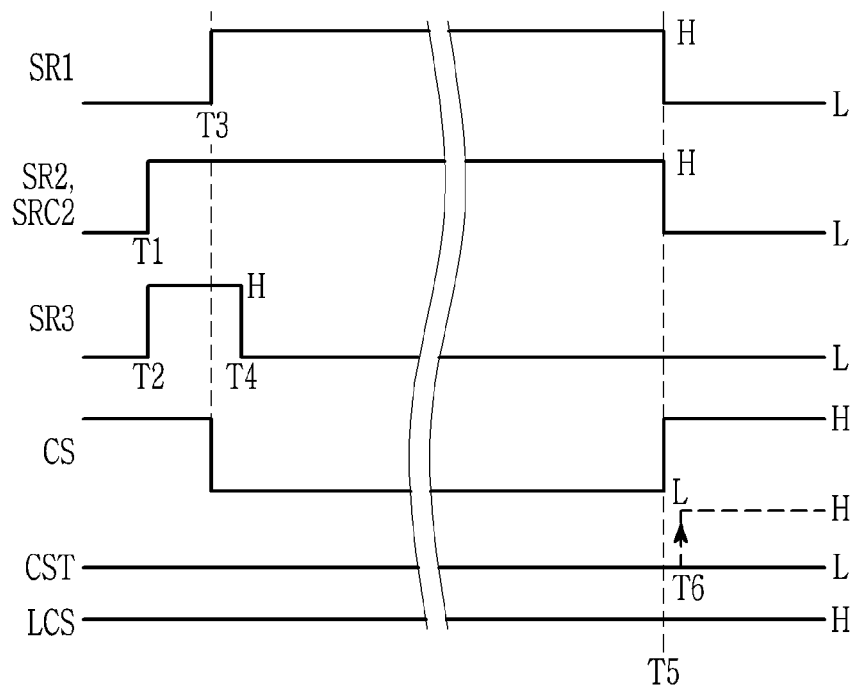
[FIG. 3]

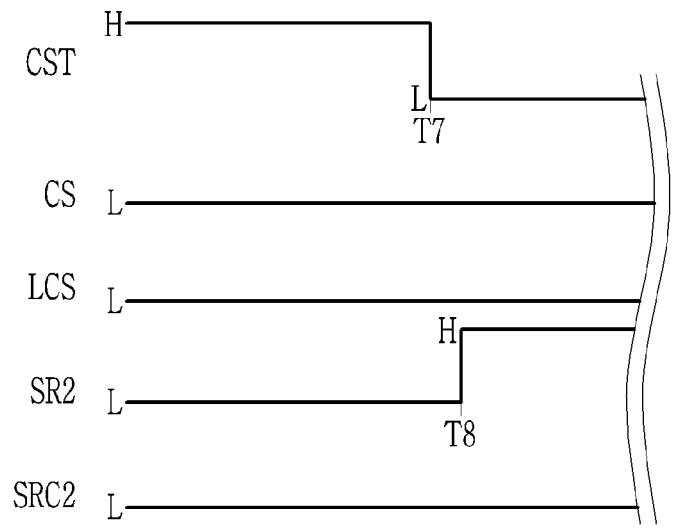
[FIG. 4]
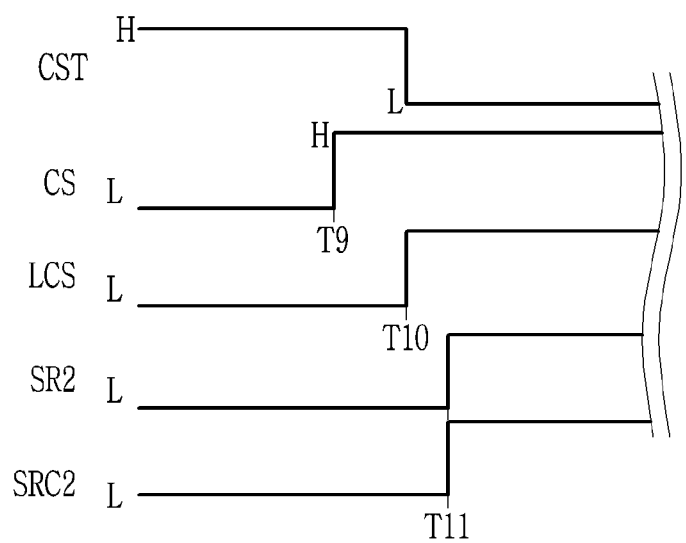
[FIG. 5]

FUSION BONDING PROTECTING MODULE AND BATTERY SYSTEM INCLUDING THE SAME

CROSS-REFERENCE TO RELATED APPLICATION

The present application is a national phase entry under 35 U.S.C. § 371 of International Application No. PCT/KR2022/013360 filed Sep. 6, 2022 which claims priority to Korean Patent Application No. 10-2021-0119710 filed on Sep. 8, 2021 in the Republic of Korea, the disclosures of which are incorporated herein by reference.

TECHNICAL FIELD

The present disclosure relates to a fusion bonding protecting module and a battery system including the same.

BACKGROUND ART

When a negative contactor connected to a negative electrode (−) of a battery is closed while a positive contactor connected to a positive electrode (+) of the battery is fused and bonded, an inrush current is generated to the negative contactor. The positive electrode and the negative contactor may then both be fused and bonded.

When the positive contactor is fused and bonded by using software installed in a battery management system, the negative contactor may be inoperable. However, a fault clear operation may be performed or other software of the battery management system may be operated to close the negative contactor.

SUMMARY

Technical Problem

The task to be achieved by the present invention is to provide a cell balancing circuit capable of reducing the number of parts of the cell balancing circuit, and thus reducing a unit cost, and a battery system including the same.

The present invention has been made in an effort to provide a hardwired fusion bonding protecting module for improving a limit generated in a contactor protecting operation using software, and a battery system including the same.

Technical Solution

An embodiment of the present invention provides a fusion bonding protecting module configured to control a negative contactor connected between a negative electrode of a battery pack and a second output end according to fusion and bonding of a positive contactor connected between a positive electrode of the battery pack and a first output end, including: an set/reset (SR) latch including a set terminal configured to receive a fusion bonding sensing signal according to whether the positive contactor is fused and bonded and a reset terminal for receiving a comparison signal according to a voltage difference between a first end and a second end of the positive contactor; and an AND gate configured to generate a compensation control signal in response to receiving both a logic control signal that is an inverted output of the SR latch and a control signal for controlling the negative contactor.

The fusion bonding protecting module may further include a comparator configured to generate the comparison signal based on the voltage difference between the first end and the second end of the positive contactor being equal to or greater than a predetermined threshold value.

In a condition when the fusion and bonding of the positive contactor is sensed, the fusion bonding sensing signal reaches a first level, and subsequently the fusion bonding sensing signal reaches a second level that is different from the first level, and when the comparison signal indicates that the voltage difference between a first end and the second end of the positive contactor is less than a predetermined threshold value, the AND gate is configured to generate a compensation control signal for opening the negative contactor according to the logic control signal.

In a condition when the fusion and bonding of the positive contactor is sensed, the fusion bonding sensing signal reaches a first level, and subsequently the fusion bonding sensing signal reaches a second level that is different from the first level, and when the comparison signal indicates that the voltage difference between the first end and the second end of the positive contactor is equal to or greater than a predetermined threshold value, the AND gate is configured to generate the compensation control signal according to a logic level of the control signal.

The SR latch is configured to generate the logic control signal to be at logic level '0' when the comparison signal is at logic level '0' and the fusion bonding sensing signal is at logic level '1', the SR latch is configured to generate the logic control signal to be at logic level '1' when the comparison signal is at logic level '1' and the fusion bonding sensing signal is at logic level '0', and the SR latch is configured to maintain a level of the logic control signal when the comparison signal and the fusion bonding sensing signal are at logic level '0'.

Another embodiment of the present invention provides a battery system including: a positive contactor connected between a positive electrode of a battery pack and a first output end; a negative contactor connected between a negative electrode of the battery pack and a second output end; a main controller configured to control the positive contactor and the negative contactor to be opened and closed, and generate a fusion bonding sensing signal according to whether the positive contactor is fused and bonded; and a fusion bonding protecting module configured to control the negative contactor according to a control signal received from the main controller when a voltage difference between a first end and a second end of the positive contactor is equal to or greater than a predetermined threshold value, and to maintain the negative contactor to be opened irrespective of the control signal when the voltage difference is less than the predetermined threshold value.

The fusion bonding protecting module may include: a comparator configured to generate the comparison signal by comparing whether the voltage difference is equal to or greater than the predetermined threshold value; an SR latch including a set terminal configured to receive the fusion bonding sensing signal and a reset terminal configured to receive the comparison signal; and an AND gate configured to generate a compensation control signal in response to receiving both a logic control signal that is an inverted output of the SR latch and the control signal.

In a condition when the fusion and bonding of the positive contactor is sensed, the fusion bonding sensing signal reaches a first level, and subsequently the fusion bonding sensing signal reaches a second level that is different from the first level, and when the comparator generates the comparison signal for indicating that the voltage difference is less than the predetermined threshold value, the SR latch is configured to generate the logic control signal at logic level '0'. The AND gate is configured to generate a compensation control signal at a level for opening the negative contactor according to the logic control signal at the logic level '0'.

In a condition when the fusion and bonding of the positive contactor is sensed, the fusion bonding sensing signal reaches a first level, and subsequently the fusion bonding sensing signal reaches a second level that is different from the first level, and when the comparator generates a comparison signal indicating that the voltage difference is equal to or greater than the predetermined threshold value, the SR latch is configured to generate the logic control signal at logic level '1'. The AND gate is configured to generate the compensation control signal according to the control signal at the logic level '1'.

Advantageous Effects

The present disclosure provides the fusion bonding protecting module for preventing risky conditions in advance by preventing multiple fusion and bonding of the contactor when the positive contactor is fused and bonded, and a battery system including the same.

BRIEF DESCRIPTION OF THE DRAWINGS

FIG. 2 shows a fusion bonding protecting module according to an embodiment.

FIG. 3 shows a waveform diagram of signals of a battery system in a normal state according to an embodiment.

FIG. 4 shows a waveform diagram of signals of a battery system while a positive contactor is fused and bonded according to an embodiment.

FIG. 5 shows a waveform diagram of signals of a battery system while a positive contactor is fused and bonded according to an embodiment.

DETAILED DESCRIPTION

Figure 1:
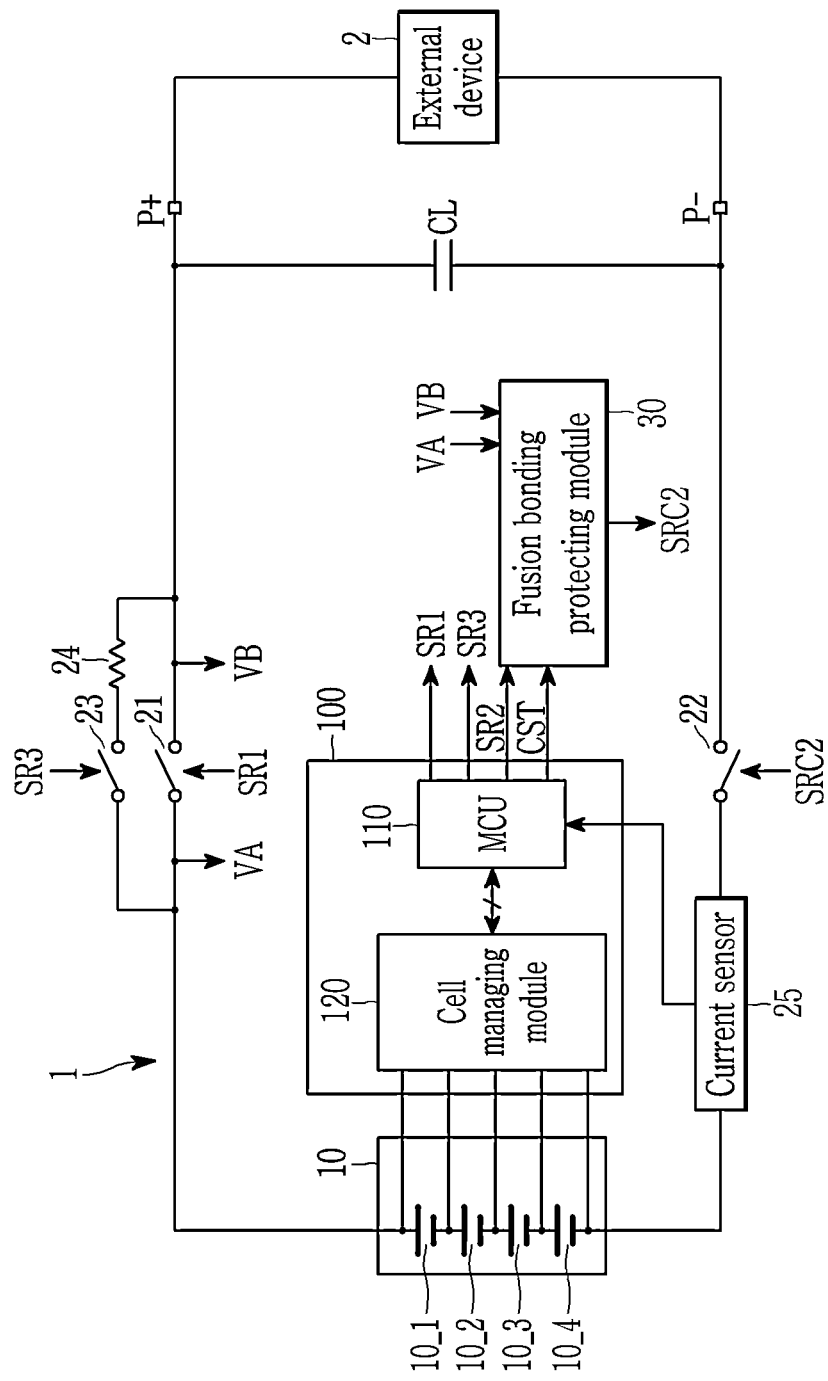
FIG. 1 shows a schematic diagram of a battery system according to an embodiment.

The present disclosure provides a hardwired system for preventing multiple fusion and bonding of a contactor when a positive contactor connected to a positive electrode (+) of the battery is fused and bonded. When software of the battery management system diagnoses fusion bonding of the positive contactor, and an SR latch and an AND gate are used so that arbitrary software of the battery management system performs a closing instruction on the negative contactor connected to the negative electrode (−) of the battery, the negative contactor is not closed. The present disclosure confirms whether the positive contactor is fused and bonded, and resets the SR latch when the fusion and bonding status is solved.

The terms "module" and "unit" for components used in the following description are used only in order to make the specification easier. Therefore, these terms do not have meanings or roles that distinguish them from each other by themselves. In addition, the terms "-er", "-or", and "module" described in the specification mean units for processing at least one function and operation, and can be implemented by hardware components or software components, and combinations thereof.

In describing embodiments of the present specification, when it is determined that a detailed description of the well-known art associated with the present invention may obscure the gist of the present invention, it will be omitted. The accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not interpreted as limiting these components. The terms are only used to differentiate one component from others.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "connected or coupled directly" to another component, it may be connected or coupled to another component without the other component intervening therebetween.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

FIG. 1 shows a schematic diagram of a battery system according to an embodiment.

As shown in FIG. 1, an external device 2 is connected between respective output ends P+ and P− of the battery system 1, and when the relays 21 and 22 are closed, the battery pack 10 may be electrically connected to the external device 2. A link capacitor CL is connected between the respective output ends P+ and P− of the battery system 1, and a voltage between respective ends of the link capacitor CL is an output voltage of the battery system 1.

When the external device 2 is an electric load, the battery system 1 may be operable as a power source for supplying energy to the electric load 2 and may be discharged. The electric load may be a moving means or an energy storage system (ESS), and the moving means may, for example, be an electric vehicle, a hybrid vehicle, or smart mobility. When the external device 2 is a charger, the battery system 1 may receive energy from a power system through the charger 2, and may be charged.

The battery system 1 includes a battery pack 10, a positive contactor 21, a negative contactor 22, a precharge contactor 23, a precharge resistor 24, a current sensor 25, a fusion bonding protecting module 30, and a battery management system BMS 100.

The battery pack 10 includes a plurality of battery cells 10_1 to 10_4 connected in series. FIG. 1 shows that the battery pack 10 includes four battery cells 10_1 to 10_4 connected in series, which is an example and is not limited thereto. For example, five or more battery cells may be connected in series, or two or more battery cells connected in parallel may be connected in series.

The positive contactor 21 is connected between the positive electrode of the battery pack 10 and the output terminal P+, the negative contactor 22 is connected between the negative electrode of the battery pack 10 and the output terminal P−, and the precharge contactor 23 and the precharge resistor 24 connected in series are connected to the positive contactor 21 in parallel and are connected between the positive electrode of the battery pack 10 and the output terminal P+. In a normal state in which the positive contactor 21 is not fused and bonded, it may be controlled to open and close the positive electrode, the negative electrode, and the precharge contactors 21, 22, and 23 according to control by a main control unit MCU 110 of the BMS 100. The positive contactor 21 may be opened or closed by a control signal SR1, the negative contactor 22 may be opened or closed by a control signal SR2, and the precharge contactor 23 may be opened or closed by a control signal SR3.

The current sensor 25 may sense a current flowing to the battery pack 10, and may transmit a current sensing signal IS for indicating the sensed current to the MCU 110.

The BMS 100 includes a MCU 110 and a cell managing module 120.

The cell managing module 120 may be connected to the battery cells 10_1 to 10_4, cell voltages and temperatures of the battery cells 10_1 to 10_4 are measured and transmitted to the MCU 110, and a balancing operation may be performed on a specific cell from among the battery cells 10_1 to 10_4 according to a cell balancing control signal received from the MCU 110.

Software including programs including charging and discharging control, cell balancing control, and protecting operation control on the battery pack 10 is installed in the MCU 110. The MCU 110 may control charging and discharging, cell balancing, and protecting operations on the battery pack 10 based on information and signals received from the cell managing module 120, the current sensor 25, and the outside.

When the external device 2 is connected to the battery system 1 and charging or discharging is performed, the MCU 110 may close the negative contactor 22 and the precharge contactor 23, and may close the positive contactor 21 after a predetermined time. In this instance, the predetermined time may be set from a time when the precharge contactor 23 is closed to a time when a link capacitor voltage charged in the link capacitor CL reaches a predetermined ratio (e.g., 95%) with respect to a voltage of the battery pack 10.

The MCU 110 may close the positive contactor 21 and may then open the precharge contactor 23. While the battery pack 10 is charged or discharged, the positive contactor 21 and the negative contactor 22 may be closed, and a charging current path or a discharging current path may be configured. The MCU 110 may adjust levels of the control signals SR1 to SR3 t control the positive contactor, the negative contactor, and the precharge contactor to be opened or closed.

When the battery system 1 is electrically disconnected (i.e., Off), and a voltage is less than a predetermined threshold value between a first end voltage VA of the positive contactor 21 and a second end voltage VB of the positive contactor 21, the MCU 110 may determine the positive contactor 21 to be fused and bonded. The voltage VA may be a voltage at a first end of the positive contactor 21 provided near the positive electrode of the battery pack 10, and the voltage VB may be a voltage at a second end of the positive contactor 21 provided near the output terminal P+.

The MCU 110 senses the fused and bonded state of the positive contactor 21, and generates a fusion bonding sensing signal CST. The MCU 110 may generate a high-level fusion bonding sensing signal CST when sensing that the positive contactor 21 is fused and bonded, and it may generate a low-level fusion bonding sensing signal CST when the positive contactor 21 is not fused and bonded but is in a normal state. The MCU 110 may generate a low-level fusion bonding sensing signal CST according to a fusion bonding clear signal supplied from the outside. For example, when the fusion and bonding of the positive contactor 21 is physically solved by maintenance, the BMS 100 may receive the fusion bonding clear signal from the outside through communication, and may transmit the same to the MCU 110. The MCU 110 may reset the high-level fusion bonding sensing signal CST to be low-level.

The fusion bonding protecting module 30 may receive a control signal SR2 from the MCU 110, may generate a compensation control signal SRC2 on a level for opening the negative contactor 22 regardless of a level of the control signal SR2 and may supply the same to the negative contactor 22 when the positive contactor 21 is fused and bonded, and may generate the compensation control signal SRC2 according to the level of the control signal SR2 and may supply the same to the negative contactor 22 when the positive contactor 21 is not fused and bonded but is in the normal state.

FIG. 2 shows a fusion bonding protecting module according to an embodiment.

The fusion bonding protecting module 30 includes a comparator 31, an SR latch 32, and an AND gate 33.

The comparator 31 compares the first end voltage VA and the second end voltage VB of the positive contactor 21, generates a high-level output when the difference between the voltage VA and the voltage VB is equal to or greater than a predetermined threshold value, and generates a low-level output in another case. An output of the comparator 31 will be referred to as a comparison signal CS.

The comparator 31 determines whether the positive contactor 21 is fused and bonded, and the threshold value between the voltage VA and the voltage VB is equal to or greater than a threshold value when the positive contactor 21 is not fused and bonded but is in the normal state so the comparator 31 may generate a high-level comparison signal CS and may output the same. When the positive contactor 21 is fused and bonded, the difference between the voltage VA and the voltage VB is less than the threshold value so the comparator 31 may generate a low-level comparison signal CS and may output the same.

The SR latch 32 may provide outputs and inverted outputs according to a logic level of a signal supplied to a set terminal S and a logic level of a signal supplied to a reset terminal R through an output terminal Q and an inverted output terminal Q'. According to an embodiment, an inverted output from the SR latch 32 is provided to the AND gate 33, and the inverted output from the SR latch 32 is referred to as a logic control signal LCS. The logic level of the signal supplied to the set terminal S and the reset terminal R of the SR latch 32 may be '0' or '1'. The fusion bonding sensing signal CST is input to the set terminal S of the SR latch 32, and the comparison signal CS is input to the reset terminal R of the SR latch 32.

A method for the SR latch 32 to determine the logic levels of the outputs and the inverted outputs according to the logic levels of the signals input to the set terminal S and the reset terminal R is expressed in Table 1.

TABLE 1

| S | R | Q | Q' |
|---|---|---|---|
| 0 | 0 | previous output | previous inverted output |
| 0 | 1 | 0 | 1 |
| 1 | 0 | 1 | 0 |
| 1 | 1 | 0 | 0 |

The AND gate 33 ANDs the control signal SR2 and the logic control signal LCS to generate a compensation control signal SRC2. When the logic control signal LCS has the low level that corresponds to the logic level '0', the AND gate 33 generates a low-level compensation control signal SRC2 irrespective of the level of the control signal SR2. The negative contactor 22 is opened by the compensation control signal SRC2. While the logic control signal LCS is at the low level, the negative contactor 22 may be maintained to be opened. When the logic control signal LCS is at the high level that corresponds to the logic level '1', the AND gate 33 generates a compensation control signal SRC2 according to the logic level of the control signal SR2. That is, when the control signal SR2 has the high level that corresponds to the logic level '1' for indicating the closing of the negative contactor 22, the AND gate 33 generates a high-level compensation control signal SRC2. When the control signal SR2 has the low level that corresponds to the logic level '0' for indicating the opening of the negative contactor 22, the AND gate 33 generates a low-level compensation control signal SRC2. The negative contactor 22 is closed by the high-level compensation control signal SRC2, and is opened by the low-level compensation control signal SRC2.

An operation of the fusion bonding protecting module according to an embodiment will now be described with reference to FIG. 3 to FIG. 5.

FIG. 3 shows a waveform diagram of signals of a battery system in a normal state according to an embodiment.

At a time T1, the control signal SR2 becomes high level to close the negative contactor 22. At a time T2, the control signal SR3 becomes high level to close the precharge contactor 23. The time T1 may be prior to the time T2, or the time T1 and the time T2 may be the same. At a time T3, the control signal SR1 becomes high level to close the positive contactor 21, and at a time T4, the control signal SR3 becomes low level to open the precharge contactor 23.

As the positive contactor 21 is opened before the time T3, the voltage difference between the voltage VA and the voltage VB is equal to or greater than the threshold value and the comparison signal CS is at the high level. As the state is normal, the fusion bonding sensing signal CST is at the low level. Therefore, the logic control signal LCS is at the high level by the high-level comparison signal CS.

After the time T3, the positive contactor 21 is closed so the voltage difference between the voltage VA and the voltage VB is less than the threshold value, and the comparison signal CS is at the low level. As the fusion bonding sensing signal CST and the comparison signal CS are at the low level, the SR latch 32 maintains the logic control signal LCS at the high level. As the high-level logic control signal LCS is input to the AND gate 33, the AND gate 33 generates the compensation control signal SRC2 according to the control signal SR2. Therefore, the compensation control signal SRC2 may have a same waveform as the control signal SR2.

At a time T5, the control signals SR1 and SR2 are at the low level, and the positive contactor 21 and the negative contactor 22 are opened. After the time T5, the voltage difference between the voltage VA and the voltage VB is equal to or greater than the threshold value, and the comparison signal CS is at the high level. The SR latch 32 maintains the logic control signal LCS at the high level according to the high-level comparison signal CS.

According to an embodiment, the positive contactor 21 is opened, and the MCU 110 then diagnoses whether the positive contactor 21 is fused and bonded. For example, at a time T6, the MCU 110 may sense the fusing and bonding of the positive contactor 21, and the fusion bonding sensing signal CST may increase to the high level.

FIG. 4 shows a waveform diagram of signals of a battery system while a positive contactor is fused and bonded according to an embodiment.

FIG. 4 shows a waveform diagram when the positive contactor 21 is fused and bonded, the fusion and bonding of the positive contactor 21 is not solved, a fault clear is performed by the software installed in the MCU 110, and the fusion bonding sensing signal CST is changed to low level from high level at a time T7.

After the time T7, the fusion bonding sensing signal CST is at the low level, and the comparison signal CS is at the low level so the logic control signal LCS is maintained at the low level. Hence, the AND gate 33 outputs the low-level compensation control signal SRC2 irrespective of the control signal SR2. For example, at a time T8, the control signal SR2 rises to the high level, and the compensation control signal SRC2 is maintained at the low level.

FIG. 5 shows a waveform diagram of signals of a battery system while a positive contactor is fused and bonded according to an embodiment.

FIG. 5 shows a waveform diagram when the fusion and bonding of the positive contactor 21 is sensed, the fusion and bonding of the actual positive contactor 21 is solved, and the fault clear is performed by the software installed in the MCU 110, or a signal for the fault clear is transmitted to the BMS 100 from the outside. For example, it will be assumed that the fusion and bonding of the positive contactor 21 is solved at a time T9.

At the time T9, the fusion and bonding of the positive contactor 21 is solved so the voltage difference between the voltage VA and the voltage VB becomes equal to or greater than the threshold value, and the comparison signal CS becomes high level. At a time T10, the fusion bonding sensing signal CST is changed to low level from high level by the fault clear. After the time T10, the SR latch 32 generates the high-level logic control signal LCS according to the high-level comparison signal CS and the low-level fusion bonding sensing signal CST. Therefore, the AND gate 33 determines the level of the compensation control signal SRC2 according to the control signal SR2 and outputs a resultant signal.

For example, when the control signal SR2 rises to the high level at a time T11, the AND gate 33 changes the compensation control signal SRC2 to high level from low level.

In the present specification, it is described that the signal level that corresponds to the logic level '0' is the low level, and the signal level that corresponds to the logic level '1' is the high level. For example, the control signals SR1 to SR3 output by the MCU 110, the fusion bonding sensing signal CST, input and output signals of the SR latch 32, the output signal of the comparator 31, and the input and output signals of the AND gate 33 may be at the low level corresponding to the logic level '0', and may be at the high level corresponding to the logic level '1'. This is an example for describing an embodiment, and the present disclosure is not limited thereto.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

The invention claimed is:

1. A fusion bonding protecting module configured to control a negative contactor connected between a negative electrode of a battery pack and a second output end according to fusion and bonding of a positive contactor connected between a positive electrode of the battery pack and a first output end, comprising:
   a set/reset (SR) latch including a set terminal configured to receive a fusion bonding sensing signal according to whether the positive contactor is fused and bonded and a reset terminal for receiving a comparison signal according to a voltage difference between a first end and a second end of the positive contactor; and
   an AND gate configured to generate a compensation control signal in response to receiving both a logic control signal that is an inverted output of the SR latch and a control signal for controlling the negative contactor.

2. The fusion bonding protecting module of claim 1, further comprising
   a comparator configured to generate the comparison signal based on the voltage difference between the first end and the second end of the positive contactor being equal to or greater than a predetermined threshold value.

3. The fusion bonding protecting module of claim 1, wherein in a condition when the fusion and bonding of the positive contactor is sensed, the fusion bonding sensing signal reaches a first level, and subsequently the fusion bonding sensing signal reaches a second level that is different from the first level, and
   when the comparison signal indicates that the voltage difference between the first end and the second end of the positive contactor is less than a predetermined threshold value, the AND gate is configured to generate a compensation control signal for opening the negative contactor according to the logic control signal.

4. The fusion bonding protecting module of claim 1, wherein
   in a condition when the fusion and bonding of the positive contactor is sensed, the fusion bonding sensing signal reaches a first level, and subsequently the fusion bonding sensing signal reaches a second level that is different from the first level, and
   when the comparison signal indicates that the-voltage difference between the first end and the second end of the positive contactor is equal to or greater than a predetermined threshold value, the AND gate is configured to generate the compensation control signal according to a logic level of the control signal.

5. The fusion bonding protecting module of claim 1, wherein
   the SR latch is configured to generate the logic control signal to be at logic level '0' when the comparison signal is at the logic level '0' and the fusion bonding sensing signal is at logic level '1',
   the SR latch is configured to generate the logic control signal to be at the logic level '1' when the comparison signal is at the logic level '1' and the fusion bonding sensing signal is at the logic level '0', and
   the SR latch is configured to maintain a level of the logic control signal when the comparison signal and the fusion bonding sensing signal are at the logic level '0'.

6. A battery system comprising:
   a positive contactor connected between a positive electrode of a battery pack and a first output end;
   a negative contactor connected between a negative electrode of the battery pack and a second output end;
   a main controller is configured to control the positive contactor and the negative contactor to be opened and closed, and to generate a fusion bonding sensing signal according to whether the positive contactor is fused and bonded; and
   a fusion bonding protecting module configured to control the negative contactor according to a control signal received from the main controller when a voltage difference between a first end and a second end of the positive contactor is equal to or greater than a predetermined threshold value, and to maintain the negative contactor to be opened irrespective of the control signal when the voltage difference is less than the predetermined threshold value.

7. The battery system of claim 6, wherein
the fusion bonding protecting module includes:
   a comparator configured to generate the comparison signal by comparing whether the voltage difference is equal to or greater than the predetermined threshold value;
   an SR latch including a set terminal configured to receive the fusion bonding sensing signal and a reset terminal configured to receive the comparison signal; and
   an AND gate configured to generate a compensation control signal by in response to receiving both a logic control signal that is an inverted output of the SR latch and the control signal.

8. The battery system of claim 7, wherein
in a condition when the fusion and bonding of the positive contactor is sensed, the fusion bonding sensing signal reaches a first level, and subsequently the fusion bonding sensing signal reaches a second level that is different from the first level, and
when the comparator generates the comparison signal for indicating that the voltage difference is less than the predetermined threshold value, the SR latch is configured to generate the logic control signal at logic level '0'.

9. The battery system of claim 8, wherein
the AND gate is configured to generate a compensation control signal at a level for opening the negative contactor according to the logic control signal at the logic level '0'.

10. The battery system of claim 7, wherein
in a condition when the fusion and bonding of the positive contactor is sensed, the fusion bonding sensing signal reaches a first level, and subsequently the fusion bonding sensing signal reaches a second level that is different from the first level, and
when the comparator generates a comparison signal indicating that the voltage difference is equal to or greater than the predetermined threshold value, the SR latch is configured to generate the logic control signal at logic level '1'.

11. The battery system of claim 10, wherein
the AND gate is configured to generate the compensation control signal according to the control signal by the logic control signal at the logic level '1'.

* * * * *